United States Patent [19]

Quate

[11] Patent Number: 5,517,280
[45] Date of Patent: May 14, 1996

[54] PHOTOLITHOGRAPHY SYSTEM

[75] Inventor: Calvin F. Quate, Stanford, Calif.

[73] Assignee: The Board of Trustees of the Leland Stanford, Jr. University, Stanford, Calif.

[21] Appl. No.: 226,784

[22] Filed: Apr. 12, 1994

[51] Int. Cl.$^6$ .................................................. H01J 3/14
[52] U.S. Cl. ....................... 355/71; 250/234; 354/227.1
[58] Field of Search ......................... 355/71; 354/227.1; 250/234

[56] References Cited

U.S. PATENT DOCUMENTS

| | | | |
|---|---|---|---|
| 5,209,117 | 5/1993 | Bennett | 73/517 R |
| 5,227,626 | 7/1993 | Ohada et al. | 250/234 |
| 5,231,286 | 7/1993 | Kajimura et al. | 250/234 |
| 5,254,854 | 10/1993 | Betzig | 250/234 |
| 5,345,815 | 9/1994 | Albrecht et al. | 73/105 |
| 5,354,985 | 10/1994 | Quate | 250/234 |

OTHER PUBLICATIONS

"Integrated optics and new wave phenomena in optical waveguides", P. K. Tien, Reviews of Modern Physics, vol. 49, No. 2, April 1977, pp. 361–362.

"Integrated Acoustooptic Circuits and Applications", Chen S. Tsai, IEEE Transactions on Ultrasonics, Ferroelectrics and Frequency Control, vol. 39, No. 5, Sep. 1992, pp. 529–554.

" Guided–Wave Acousto–Optics Interactions, Devices and Applications", Chen S. Tsai (Ed.), Springer–Verlag, 1990, pp. 79 and 250–256.

"Near–field subwavelength micropattern generation: Pipette guided argon fluoride excimer laser microfabrication", M. Rudman et al., J. Appl. Phys. 72(9), 1 Nov. 1992, pp. 4379–4383.

"Optical characteristics of 0.1 μm circular apertures in a metal film as light sources for scanning ultramicroscopy", U. Ch. Fischer, J. Vac. Sci. Technol. B 3(1), Jan./Feb. 1985, pp. 386–390.

"Near–field optical microscope using a silicon–nitride probe", N. F. van Hulst et al., Appl. Phys. Lett. 62(5), 1 Feb. 1993, pp. 461–463.

"Near–field optical scanning microscopy in reflection", U. Ch. Fischer, Appl. Phys. Lett. 52(4), 25 Jan. 1988, pp. 249–251.

"Micron–Size Optical Waveguide for Optoelectronic Integrated Circuits", T. Nagata et al., Extended Abstracts of the (List continued on next page.)

Primary Examiner—Michael L. Gellner
Assistant Examiner—D. P. Malley
Attorney, Agent, or Firm—Skjerven, Morrill, MacPherson, Franklin & Friel; David E. Steuber

[57] ABSTRACT

A photolithography system includes a plurality of cantilevers, preferably formed in a silicon wafer. Each cantilever includes a tip located near the free end of the cantilever and a waveguide which extends along the length of the cantilever and intersects the tip. An aperture is formed at the apex of the tip so that light travelling through the waveguide may exit the tip. A light switch is included in the waveguide to control the passage of light to the tip of the cantilever.

The array of cantilevers is positioned adjacent a wafer which is to be lithographed, in the manner of an atomic force microscope operating in the attractive mode. Each cantilever is a compound structure, including a thick portion and a thin portion, the latter having a preselected mechanical resonant frequency. The cantilevers are caused to vibrate at their resonant frequency and the actual frequency of vibration is detected and used to maintain a uniform spacing between the tip of the cantilever and the surface of a photoresist layer which is to be exposed. Preferably, both the vibrational motion and the control of the tip-photoresist spacing are effected by means of a capacitive plate located adjacent the cantilever.

The cantilever array is scanned over a photoresist layer on the wafer, preferably in a raster pattern, and the individual light switches are operated so as to expose individual pixels on the photoresist layer.

28 Claims, 12 Drawing Sheets

OTHER PUBLICATIONS

1993 International Conference on Solid State Devices and Materials, Makuhari, 1993, pp. 1047–1049.

"A Light Source Smaller Than the Optical Wavelength", K. Lieberman et al., Science, vol. 247, 5 Jan. 1990, pp. 59–61.

"Near–field differential scanning optical microscope with atomic force regulation", R. Toledo–Crow et al., Appl. Phys. Lett. 60(24), 15 Jun. 1992, pp. 2957–2959.

"Near–Field Optics: Microscopy, Spectroscopy, and Surface Modification Beyond the Diffraction Limit", Eric Betzig et al., Science vol. 257, 10 Jul. 1992, pp. 189–195.

"Breaking the Diffraction Barrier: Optical Microscopy on a Nanometric Scale", E. Betzig et al., Science vol. 251, 22 Mar. 1991, pp. 1468–1470.

"Combined shear force and near–field scanning optical microscopy", E. Betzig et al., Appl. Phys. Lett. 60(20), 18 May 1992, pp. 2484–2486.

PHOTOLITHOGRAPHY SYSTEM

This invention was made with Government support under contract NSF ECS-8917552, awarded by the National Science Foundation and contract ONR N0014-91-J-1050, awarded by the Office of Naval Research, Department of the Navy. The Government has certain rights in this invention.

RELATED APPLICATION

This application is related to application Ser. No. 08/072,286, filed Jun. 3, 1993, now U.S. Pat. No. 5,354,985, issued Oct. 11, 1994, which is incorporated herein by reference in its entirety.

FIELD OF THE INVENTION

This invention relates to photolithography technology and, in particular, to a photolithography system which uses a plurality of cantilevers to produce a photolithographic pattern containing extremely small features.

BACKGROUND OF THE INVENTION

In the technology of semiconductor fabrication it is well known to expose a layer of photoresist on a semiconductor wafer to a pattern of radiation, a process referred to as photolithography. The unexposed portions of the photoresist are removed by a developer solution, and the resulting photoresist pattern is used in processing the wafer. Usually the photoresist is exposed by directing the radiation through a photomask. Using ultraviolet light, these techniques can depict features having dimensions as small as approximately 0.5 μm. Photolithography systems which use x-ray technology can achieve higher resolution, but these systems are generally quite large and expensive.

Hence, there is a need for a photolithography system that can produce extremely small features (as small as, say, 0.1 μm) and yet avoid the size and cost of x-ray systems. A system using an excimer laser beam guided through a hollow glass pipette is proposed in M. Rudman et al., "Near-field subwavelength micropattern generation: Pipette guided argon fluoride excimer laser microfabrication", J. Appl. Phys., Vol. 72, 1 Nov. 1992, pp. 4379–4383, which is incorporated herein by reference.

SUMMARY OF THE INVENTION

The photolithography system of this invention includes a plurality of cantilevers. Each cantilever includes a tip near its free end and a waveguide which guides electromagnetic energy to the tip. An aperture in the waveguide at the apex of the tip allows the electromagnetic energy to escape the waveguide. A switch is included in the waveguide so as to control the electromagnetic energy which reaches the tip and exits through the aperture. The electromagnetic energy is typically in the form of UV light, but other forms of radiation, such as visible light, may also be used in embodiments of this invention.

In operation, each cantilever functions in the manner of an atomic force microscope in the attractive mode. That is, the tip of the cantilever is brought very close to the surface of the photoresist and is vibrated at its resonant frequency. Since the tip of the cantilever is located extremely close to the photoresist surface, the resonant frequency of the cantilever is determined in part by Van der Waals forces or other forces which exist between the tip and the surface. In reality, it is the gradient of the forces that changes the resonant frequency. As the gap between the tip and the surface changes, these forces vary, and this variation in turn alters the resonant frequency of the cantilever.

The resonant frequency of the cantilever is detected, and a feedback system adjusts the distance between the tip and the surface so as to maintain the resonant frequency at a constant value. As a result, the gap between the photoresist surface and the tip of the cantilever is held constant. This gap must be controlled very precisely to ensure that only the desired area of the photoresist is exposed to the radiation. Alternatively, the amplitude of the oscillations of the cantilever can be detected, and this information can be used to control the gap between the photoresist surface and the tip of the cantilever.

In a preferred embodiment, the vibration of the cantilever is detected by means of a piezoresistor which is embedded in the cantilever in such a way that its resistance varies as the cantilever bends. The resistance of the piezoresistor is detected, and this provides a signal indicative of the resonant frequency of the cantilever. Using this information, the feedback system is used to control the gap between the tip and the surface of the photoresist.

Preferably, the cantilever is compound: it includes a "bending" portion which has a relatively high mechanical resonant frequency and a "vibrating" portion which has a lower mechanical resonant frequency. The cantilever is vibrated by means of a capacitive plate, which is located adjacent the cantilever. A superimposed AC and DC signal is applied to the capacitive plate. The AC component causes the cantilever to vibrate and the DC component regulates the position of the cantilever relative to the surface of the photoresist.

The feedback loop contains the following elements. The piezoresistor is used to detect the vibrational frequency of the cantilever and delivers an output which is compared to a voltage level which represents the desired spacing between the tip and the photoresist surface. If the spacing, represented by the vibrational frequency of the cantilever, is not correct, an error signal is generated, and this error signal is delivered to circuitry which adjusts the DC component of the signal applied to the capacitive plate. This in turn produces a change in the spacing between the tip and the surface until the error signal is reduced to zero.

In the preferred embodiment, an array of cantilevers is formed in a wafer which is the same size as the wafer to be patterned. The latter is coated with photoresist, and both wafers contain dice which are congruent. The cantilevers are formed in a row in each die of the photolithographic wafer. The two wafers are brought face to face such that the tips of the cantilevers are extremely close to the surface of the photoresist. The wafer which is to be exposed is then scanned in a raster pattern in such a way that the cantilevers together cover the entire surface of the wafer. The switch in the waveguide for each cantilever is operated so as to expose individual pixels on the photoresist surface.

BRIEF DESCRIPTION OF THE DRAWINGS

The fabrication and operation of a photolithography system in accordance with this invention will become clearer by reference to the following drawings, in which.

DESCRIPTION OF THE INVENTION

This description will be divided into essentially five parts: First, the structure of an individual cantilever; second, the positioning of the cantilevers in a photolithographic wafer; third, the structure of the waveguides and other elements associated with the cantilevers; fourth, the circuitry and mechanisms for controlling the cantilevers; and fifth, the fabrication of the cantilevers and related components.

Figure 1:
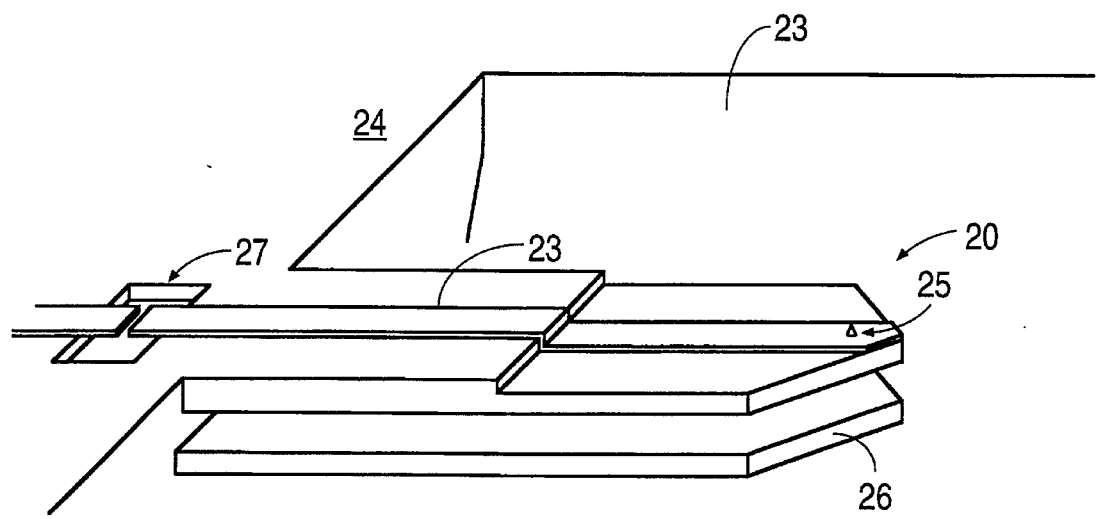
FIG. 1 illustrates a perspective view of a single compound cantilever and capacitive plate in accordance with the invention.
Figure 2A:
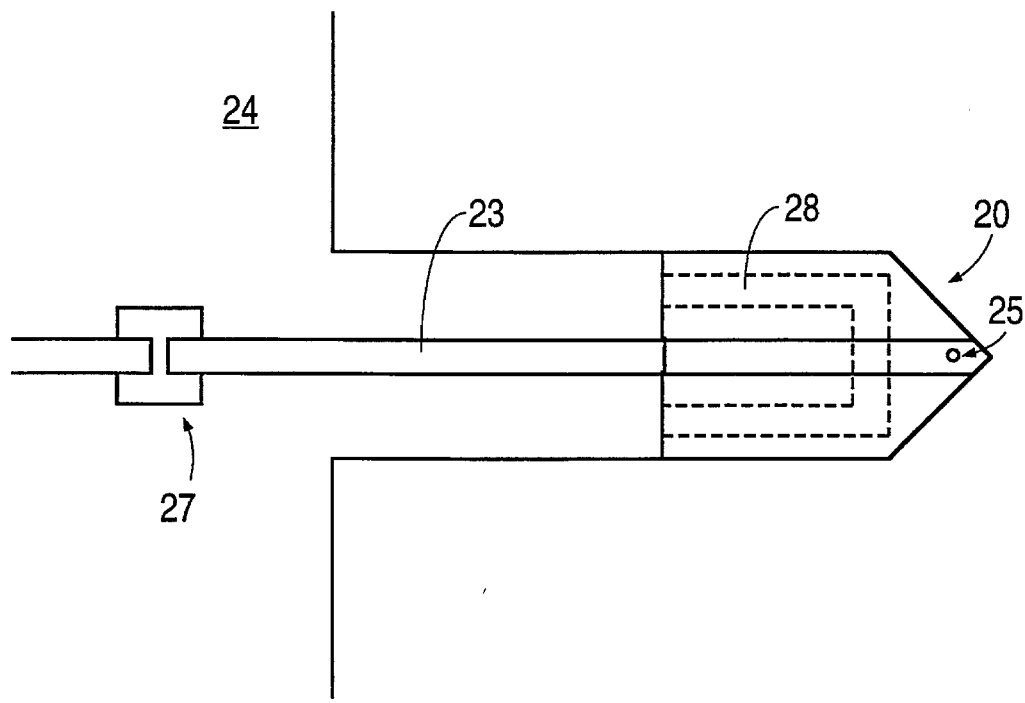
FIG. 2A illustrates a top plan view of the cantilever.
Figure 2B:
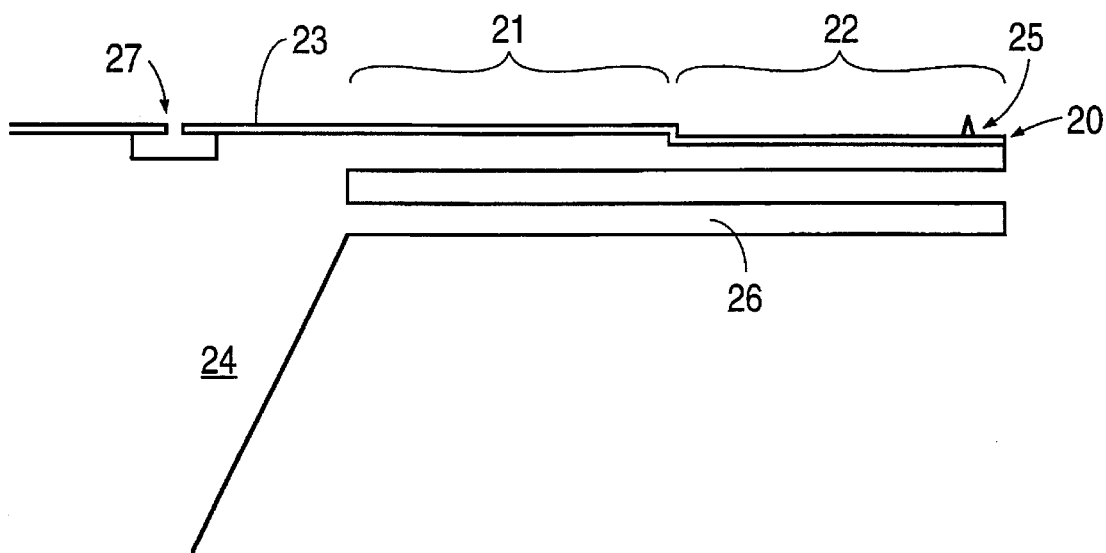
FIG. 2B illustrates a side elevational view of the cantilever and capacitive plate.

FIGS. 1, 2A and 2B illustrate the general structure of an individual cantilever 20. As is evident particularly from FIG. 2B, each cantilever 20 includes a relatively thick "bending" section 21 and a relatively thin "vibrating" section 22. A waveguide 23 extends along the top surface of cantilever 20 and intersects a tip 25. (For ease of illustration, cantilever 20 is shown with tip 25 projecting upward. In normal operation, cantilever 20 would be oriented with tip 25 projecting downward.) A small aperture (not visible in FIGS. 1, 2A and 2B) allowing light to escape from waveguide 23 is located at the apex of tip 25. This light is used to expose a layer of photoresist. The diameter of the aperture determines the resolving power of the system when the diameter is less than one-half of the wavelength of the electromagnetic energy used.

Figure 3:
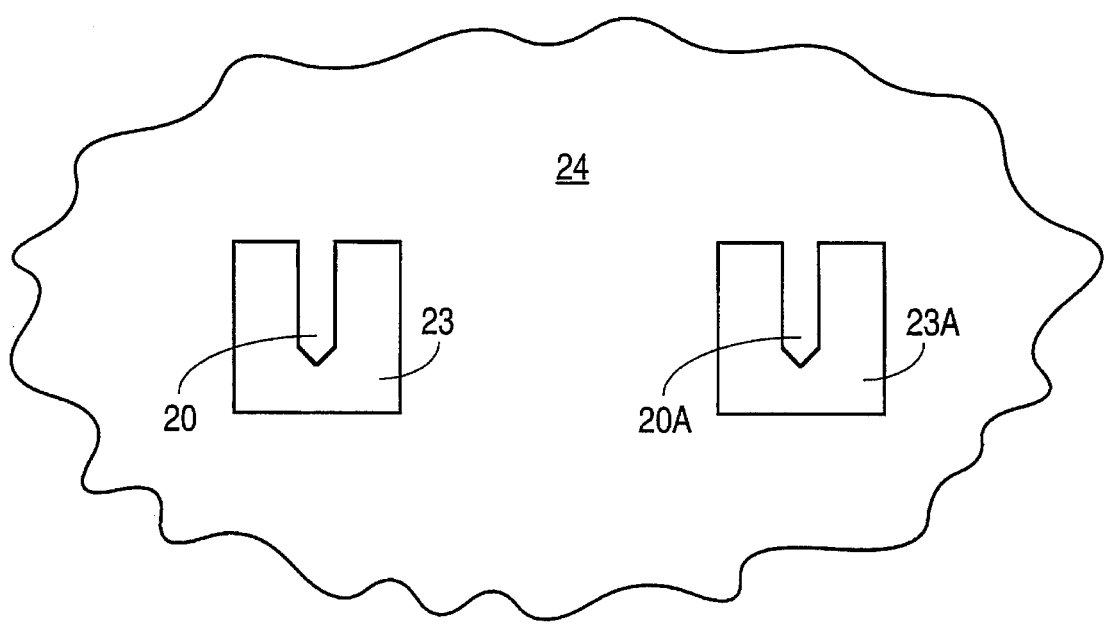
FIG. 3 illustrates two cantilevers formed side-by-side in a wafer.

Cantilever 20 projects into a window 23 which is formed in a wafer 24 (see FIG. 3). Also projecting into window 23 and adjacent to cantilever 20 is a capacitive plate 26. A light switch 27 controls the flow of light to tip 25. FIG. 2A shows a U-shaped piezoresistor 28 (dashed lines) which is formed within cantilever 20. As described below, the resistance of piezoresistor 28 varies as the "vibrating" section 22 of cantilever 20 is deflected.

Figure 4:
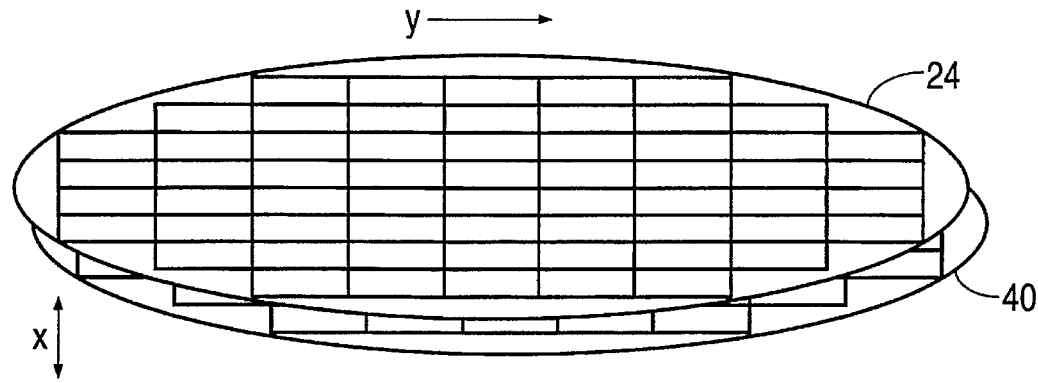
FIG. 4 illustrates the juxtaposition of a photolithographic wafer and a process wafer (i.e., a wafer to be patterned).

FIG. 4 shows photolithographic wafer 24 juxtaposed above a process wafer 40. As indicated, wafers 24 and 40 can be moved with respect to each other in an x and a y direction. The top surface of process wafer 40 is typically coated with a layer of resist that is to be exposed.

Figure 5:
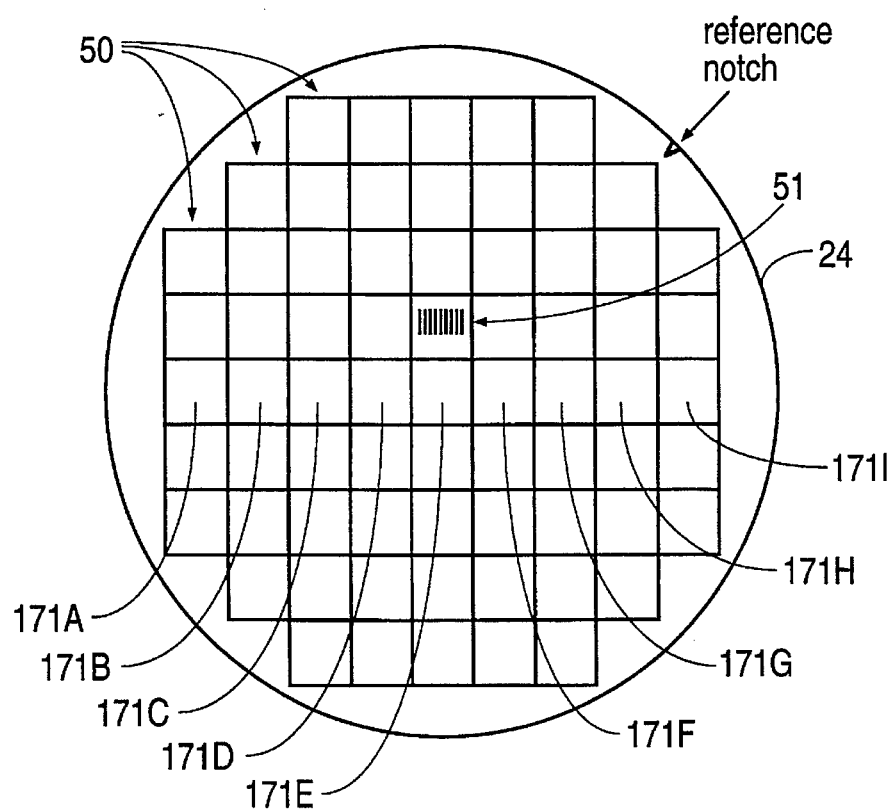
FIG. 5 illustrates the general distribution of the cantilevers on the photolithographic wafer.

FIG. 5 illustrates generally the distribution of cantilevers within wafer 24. Wafer 24 includes a plurality of dice 50, and a row of cantilevers 51 is arrayed in each of dice 50. FIG. 3 shows two cantilevers 20 and 20A positioned next to each other within windows 23 and 23A in wafer 24.

Figure 6A:
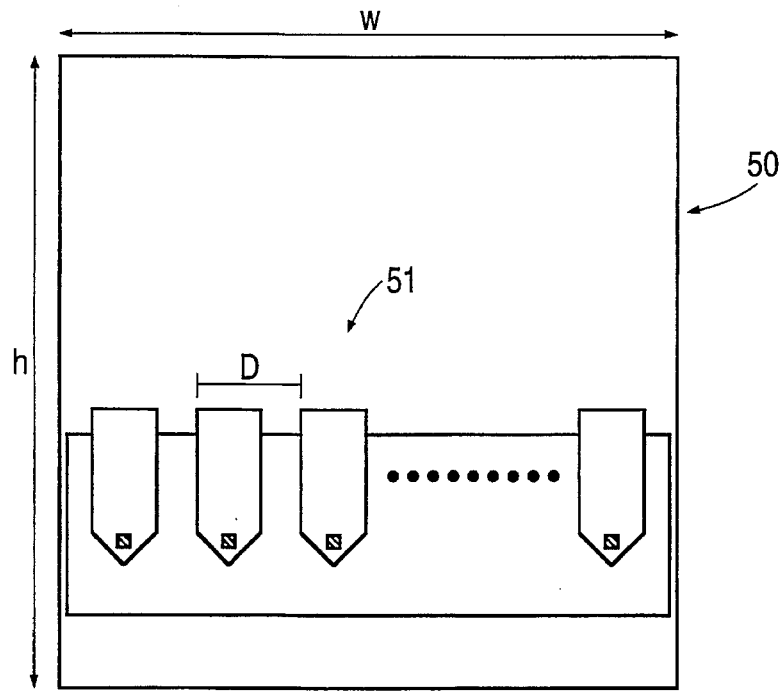
FIG. 6A illustrates the layout of a single row of cantilevers.
Figure 6B:
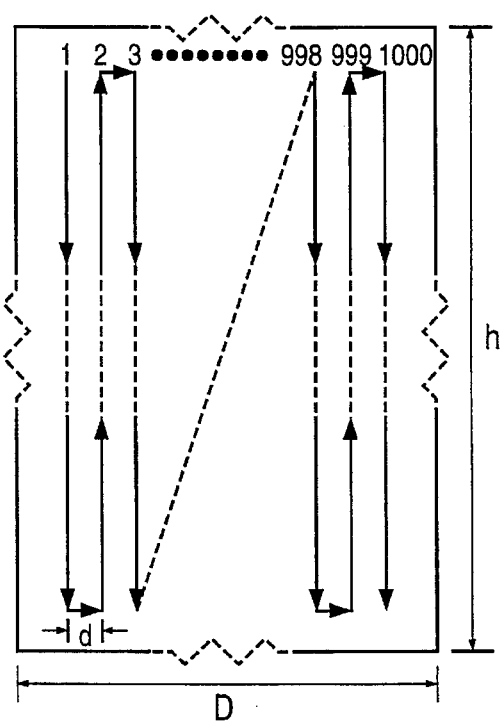
FIG. 6B illustrates the raster pattern scanned by an individual cantilever.

FIG. 6A illustrates schematically the orientation of cantilevers 51 within one of dice 50. In an illustrative embodiment, each of dice 50 may be in the shape of a square having a height h=2 cm and a width w=2 cm. There are 100 cantilevers 51 formed in a row across die 50. Accordingly, the cantilevers 51 are separated by a distance D=2 cm/100= 200 µm. As process wafer 40 is scanned, each of cantilevers 51 scans an area which measures 2 cm by 200 µm, as illustrated in FIG. 6B. If the illumination from the aperture at the end of tip 25 is 0.1 µm in diameter, for example, a series of parallel lines 0.1 µm in width will be formed as the cantilever is scanned. For complete coverage, the raster pattern illustrated in FIG. 6B is used, with each of the scanning lines being 2 cm in length and separated by a distance d=0.1 µm from the adjacent scanning line. Thus, to cover the entire 2 cm×200 µm area, a total of 2000 lines must be scanned by a single tip. Assuming that the scanning lines are in the y direction, wafers 24 and 40 are moved 0.1 µm in the x direction at the end of each scan. Since each scanning line is 2 cm in length, the tip will travel 4000 cm as it exposes the area shown in FIG. 6B. Each of the cantilevers formed in wafer 24 scans a similar area on wafer 40.

Assuming that wafer 40 is scanned in 200 seconds, the average scanning speed is 20 cm/sec. Since each tip traverses 4000 cm, it will expose 400 million 0.1 µm× 0.1 µm pixels during the 200 second period. Thus, each pixel must be exposed in two microseconds, and the optical beam must be switched on or off for each pixel in two microseconds. In principle, the cantilever could be bent away from the surface of the resist to reduce the illumination and stop the exposure.

Figure 7A:
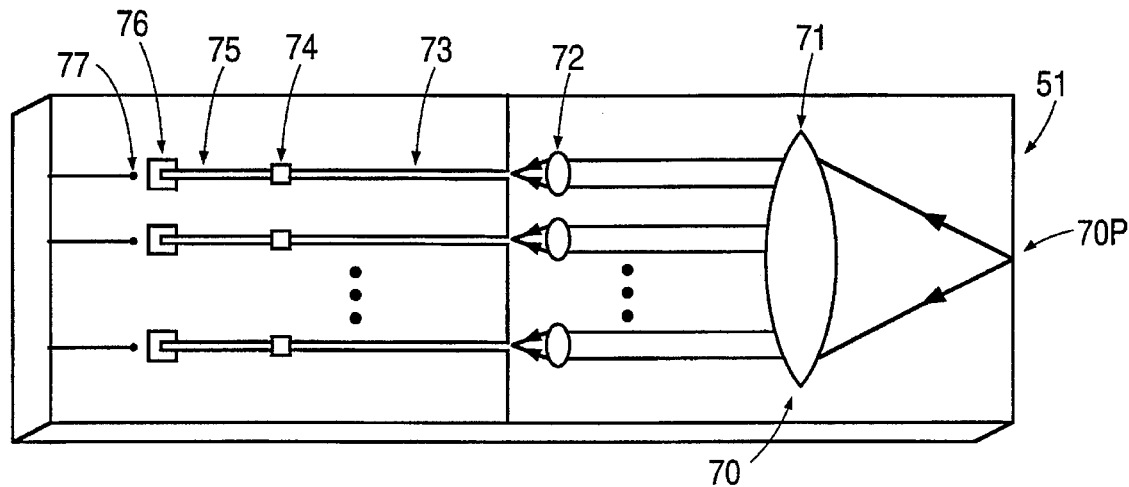
FIG. 7A illustrates schematically the waveguides and cantilevers on a single die.

FIG. 7A illustrates a general schematic view showing the cantilevers and waveguides in one of dice 50. The die includes a large planar waveguide 70. Formed in waveguide 70 are a large collimating lens 71 and a plurality of microlenses 72. Opposite each of microlenses 72 is a smaller waveguide 73 which leads to a light switch 74. From each light switch 74, a waveguide 75 directs the light to a cantilever 76. Opposite the end of each cantilever 76 is a photodiode 77 which detects when light is being directed through the tip of cantilever 76.

Lens 71 and microlenses 72 are preferably formed as thicker regions of planar waveguide 70. Since the velocity of light in a planar waveguide varies inversely with the thickness of the waveguide, lens 71 and microlenses 72 focus the light radiation as shown in FIG. 7A. Lenses of this kind are described in C. S. Tsai, "Integrated Acoustooptic Circuits and Applications", IEEE Transactions On Ultrasonics, Ferroelectrics, and Frequency Control, Vol. 39, No. 5, September 1992, pp. 529–554, which is incorporated herein by reference in its entirety. In addition, there are several alternative forms of lenses that could be used in place of the lenses shown in FIG. 7A, including lenses having a tapered thickness with parallel edges and diffraction grating lenses. These and other possible alternatives are described in *Guided-Wave Acousto-Optics*, C. S. Tsai (Ed.), Springer-Verlag (1990), pp. 79–82, 250–256, which is incorporated herein by reference.

Referring again to FIG. 4, the scanning pattern shown in FIG. 6B may preferably be generated by stepping photolithographic wafer 24 in 0.1 µm intervals in the y direction while process wafer 40 is moved back and forth in 2 cm segments in the x direction. Thus, process wafer 40 is moved 2 cm in one direction, photolithographic wafer is stepped 0.1 µm, process wafer 40 is moved 2 cm in the other direction, etc.

In this arrangement, light radiation can be introduced by means of a laser diode or another suitable laser or light source which is mounted in a fixed position relative to photolithographic wafer 24. In the example described above, one light beam would be directed to each of dice 50. As shown in FIG. 7A, the light beam enters planar waveguide 70 at a point 70P. The rays of light are made parallel by collimating lens 71 and are focused into waveguides 73 by microlenses 72. Light switches 74 control the passage of the light from waveguides 74 to each of cantilevers 76.

Figure 7B:
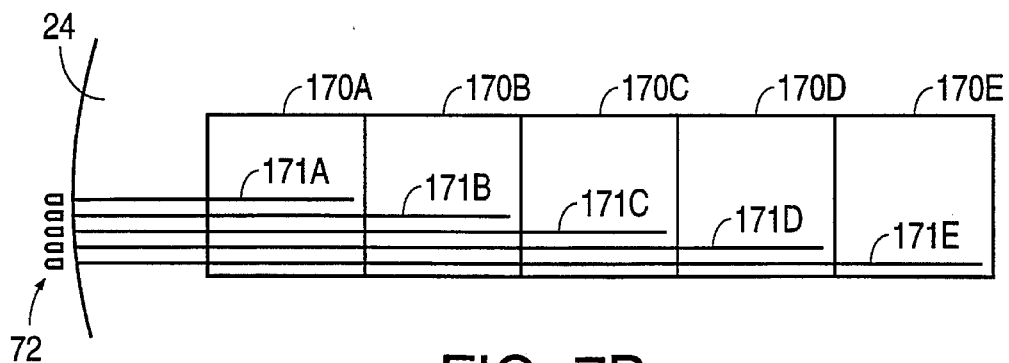
FIG. 7B illustrates the waveguides used to convey light to individual dice according to one embodiment of the invention.
Figure 7C:
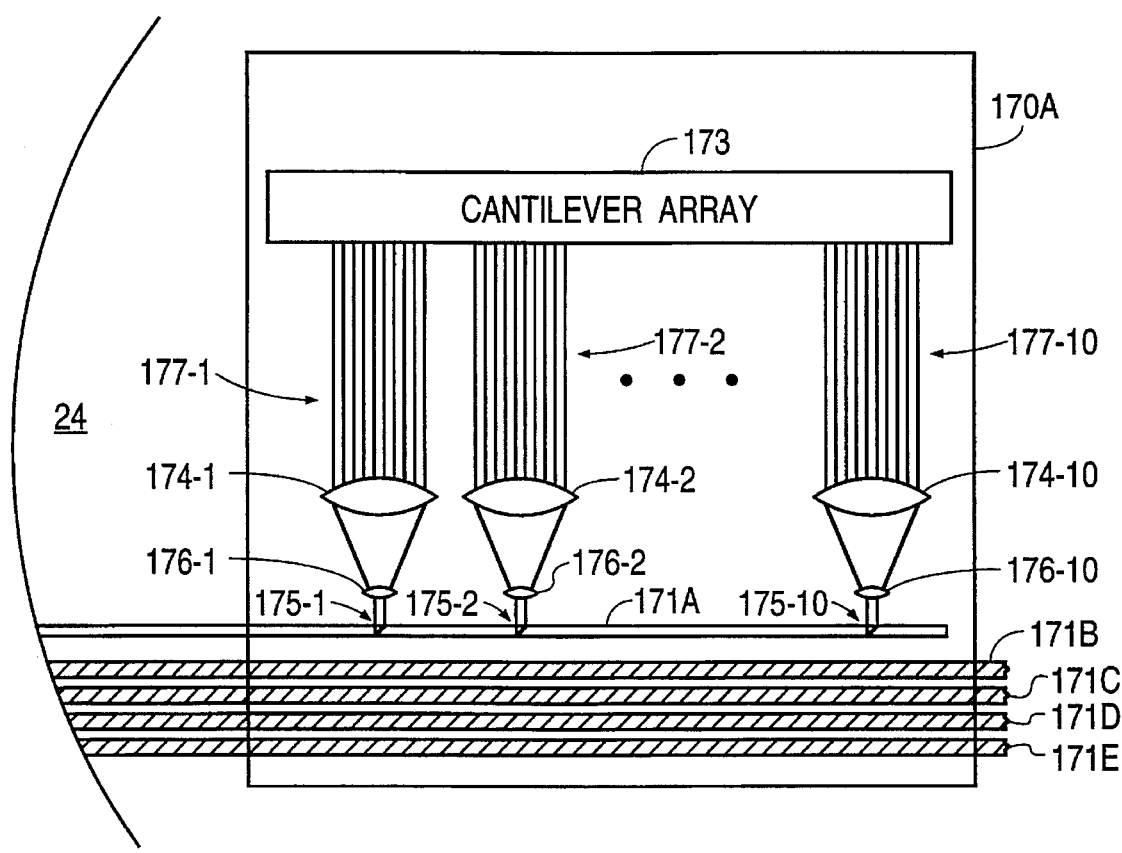
FIG. 7C illustrates the light circuitry within a single die.

An alternative arrangement for introducing the light to the planar waveguides is illustrated in FIGS. 7B and 7C. FIG. 7B illustrates a row of five adjacent dice 170A, 170B, 170C, 170D and 170E. Dice 170A–170E are also shown in FIG. 5. Also shown in FIG. 7B are a group of parallel waveguides 171A, 171B, 171C, 171D and 171E, which extend from an edge of wafer 24. Waveguide 171A extends to die 170A, waveguide 171B extends to waveguide 170B, and so forth. An array of laser diodes 172 or other suitable lasers or light sources is positioned adjacent the edge of wafer 24 and directs laser beams into adjacent ends of waveguides 171A–171E. A similar array of waveguides extends from the opposite edge of wafer 24 to dice 171F, 171G, 171H and 171I, shown in FIG. 5.

FIG. 7C illustrates the structure within die 170A. Die 170A includes a cantilever array 173 which, as noted above, contains 100 cantilevers. Die 170A also includes ten large collimating lenses 174-1 through 174-10, although to maintain the clarity of the drawing only lenses 174-1, 174-2 and 174-10 are shown in FIG. 7C. Waveguide 171A contains ten beam splitters 175-1 through 175-10, each of which splits off a portion of a laser beam traveling in waveguide 171A and directs it to one of small diverging lenses 176-1 through 176-10.

A portion of a beam of light traveling in waveguide 171A is split off by beam splitter 175-1 and passes through small lens 176-1 and large collimating lens 174-1. Large collimating lenses 174-1 through 174-10 correspond to lens 71 shown in FIG. 7A. The light beam then passes through ten light paths 177-1, each of which contains a microlens similar to microlens 72, a waveguide similar to waveguide 73, a light switch similar to light switch 74, and a waveguide similar to waveguide 75, all of which are illustrated in FIG. 7A. Similarly, other portions of the light in waveguide 171A are split off by beam splitters 175-2 through 175-10 and are directed through large collimating lenses 174-2 through 174-10 and through a plurality of parallel light paths ending at the cantilever array 173. There are a total of 100 of these parallel light paths, each of which leads to an individual cantilever within cantilever array 173.

There are numerous alternative ways of manipulating individual beams of light and directing them through light switches to individual cantilevers. Some of these techniques are described in P. K. Tien, "Integrated Optics and New Wave Phenomenon in Optical Waveguides", Review of Modern Physics, Vol. 49, No. 2, April 1977, pp. 361 et seq., which is incorporated herein by reference in its entirety.

Figure 8:
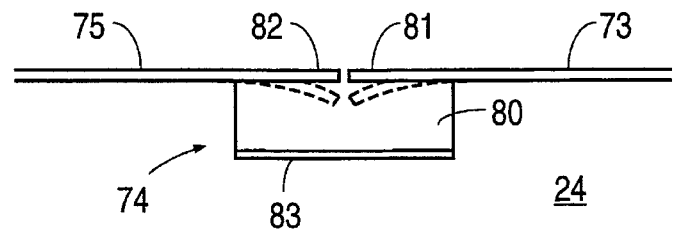
FIG. 8 illustrates a cross-sectional view of a light switch.

FIG. 8 illustrates a detailed cross-sectional view of one of light switches 74. A well 80 is formed in wafer 24. Waveguides 73 and 75 form a pair of cantilevers 81 and 82, respectively. The ends of cantilevers 81 and 82 are aligned such that light may flow from cantilever 81 to cantilever 82 when the cantilevers are in their normal position. A metal plate 83 formed at the bottom of well 80 is used to apply an electric field to cantilevers 81 and 82. The electric field deflects the cantilevers downward as shown by the dashed lines, and causes most of the light emerging from cantilever 81 to be directed into wafer 24, thereby substantially reducing the amount of light received by cantilever 82 and conveyed to one of cantilevers 76. Light switches of this kind are described in R. Watts et al., "Electromechanical Optical Switching and Modulation in Micromachined Silicon-on Insulator Waveguides", Proceedings 1991 International SOI Conference, Vail Valley, Colo. 1–3 Oct. 1991, IEEE Publication #91CH3053-6, which is incorporated herein by reference in its entirety.

Figure 9:
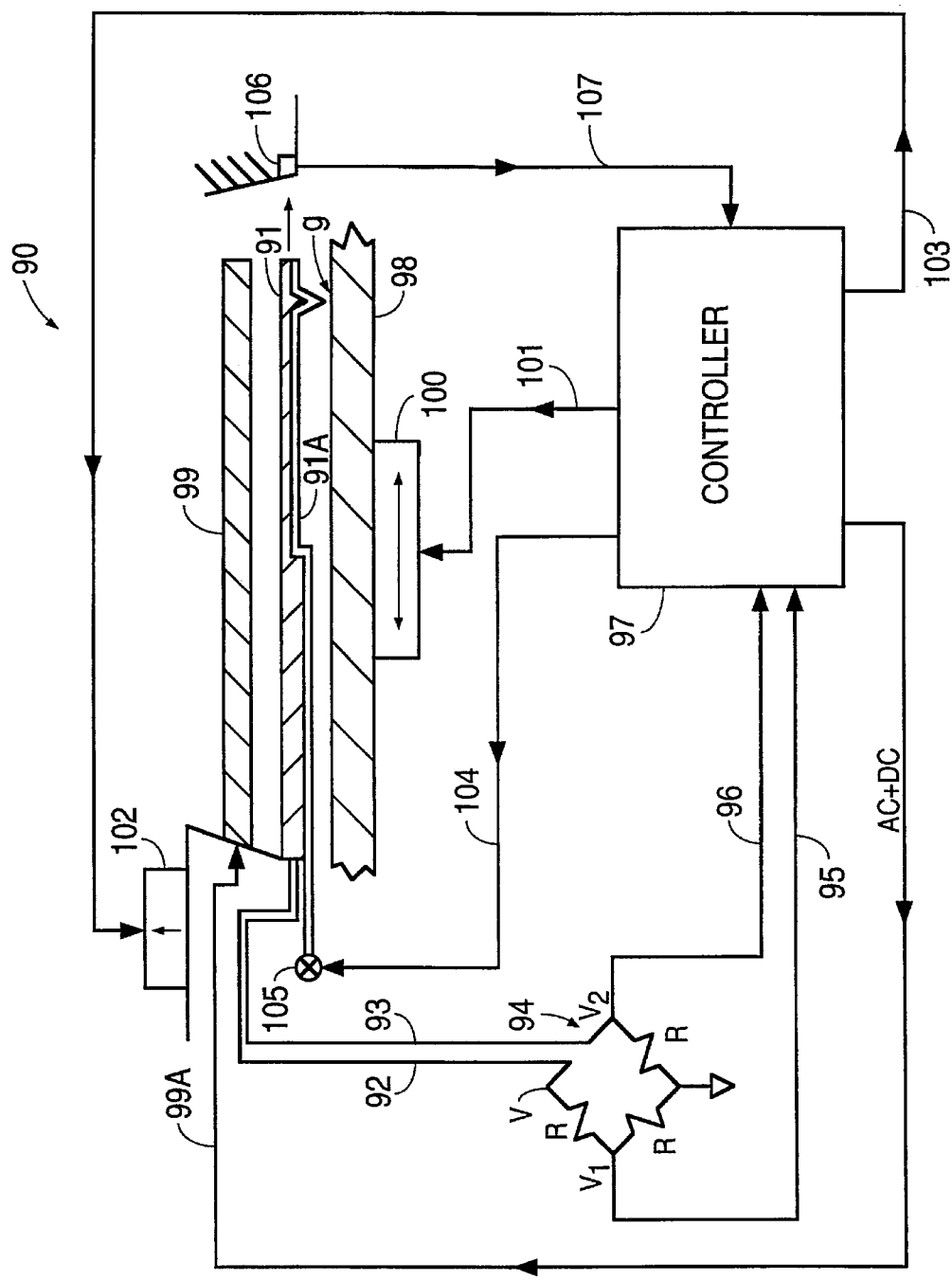
FIG. 9 illustrates a block diagram of the circuitry for controlling a single cantilever.

FIG. 9 illustrates a schematic diagram of a photolithography system 90 in accordance with the invention. A cantilever 91 includes a piezoresistor (not shown) whose terminals are connected to lines 92 and 93. Lines 92 and 93 lead to a bridge circuit 94, which has terminals connected to a voltage V and ground, respectively. The remaining terminals of bridge circuit 94 are connected to lines 95 and 96 and to a controller 97.

Bridge circuit 94 is used to detect the resistance of the piezoresistor within cantilever 91. Assuming that the resistance of the piezoresistor and each of the resistors in bridge circuit 94 is equal to R, $V_1=V_2$ when the cantilever is undeflected. When it is deflected so that the resistance of the piezoresistor becomes $R+\Delta R$, the difference between $V_1$ and $V_2$ is expressed as follows:

$$V_1 - V_2 = V \frac{\Delta R}{4R}$$

Thus, as cantilever 91 vibrates, the voltage difference $V_1-V_2$ oscillates at the same frequency, and this differential voltage is used to detect the frequency at which cantilever 91 is vibrating. This signal is delivered to controller 97 via lines 95 and 96.

Cantilever 91 is positioned with a tip extremely close to a wafer 98, the top surface of which is coated with a layer of photoresist (not shown). A waveguide 91A extends longitudinally along the bottom surface of cantilever 91, and an aperture in the waveguide is placed at the apex of the tip. A gap g, which is less than the diameter of the aperture, separates the tip from the surface of wafer 98.

A capacitive plate 99 is positioned above cantilever 91. Controller 97 delivers an AC signal to capacitive plate 99, which creates an electric field between capacitive plate 99 and cantilever 91 and causes the outer portion of cantilever 91 (i.e., the "vibrating" section) to vibrate.

As the gap g varies, the resonant frequency of cantilever 91 also varies due, as described above, to variations in the attractive forces between the tip of cantilever 91 and wafer 98. Using the output of bridge circuit 94, a rectifier (not shown) within controller 97 converts the vibrational frequency of cantilever 91 into a DC voltage, and a comparator (not shown) within controller 97 compares the DC voltage to a known reference voltage. The difference between these voltages constitutes an error voltage, and controller 97 sends a corresponding DC error signal over line 99A to capacitive plate 99. This produces a DC electric field between capacitive plate 99 and cantilever 91, and causes the thicker portion (i.e., the "bending" section) of cantilever 91 to flex. Cantilever 91 continues to flex until the gap g is adjusted to the proper level, indicating the correct spacing for proper exposure of the photoresist on the surface of wafer 98. The signal sent by controller 97 over line 99A is thus a superimposed AC-DC signal, the AC component causing cantilever 91 to vibrate and the DC component representing an error signal which adjusts the bending of cantilever 91.

Controller 97 actuates a piezoelectric device 100 via a line 101, causing wafer 98 to oscillate back and forth. Controller 97 also actuates a piezoelectric device 102 via a line 103 and thereby causes cantilever 91 to step across the surface of wafer 98. As described above, the combined oscillatory and stepping motion creates a raster scanning pattern of the kind illustrated in FIG. 6B.

Controller 97 controls the light input to cantilever 91 by providing a signal over line 104 to a light switch 105, which controls the flow of light into waveguide 91A. The operation of light switch 105 is coordinated with the movement of piezoelectric devices 100 and 102, in a known manner, so that each pixel on the surface of wafer 98 is either exposed or not exposed, as necessary to create the desired photolithographic pattern on the photoresist coating the surface of wafer 98.

A photodiode 106 positioned opposite the end of cantilever 91 detects the presence of light admitted by light switch 105, and conveys this information over a line 107 to controller 97. The signal generated by photodiode 106 is used to monitor the flow of light into waveguide 91A.

The AC signal delivered to capacitive plate 99 over line 99A is at a frequency which is one-half of the resonant frequency of cantilever 91. This is due to the fact that the force on cantilever 91 varies as the square of the electric field applied by capacitive plate 99. That is, $$F = \frac{1}{2} \epsilon E^2$$

where F is the force on cantilever 91, E is the strength of the electric field produced by capacitive plate 99, and $\epsilon$ is the dielectric constant of the substance between the capacitive plate and the cantilever (in this case air).

Since the electric field is a combined AC-DC signal, it can be represented as follows.

$$E = E_0 + E_1 \sin \omega t$$

Substituting this into the previous equation yields:

$$F = \frac{1}{2} \epsilon E^2 = \frac{1}{2} \epsilon (E_0^2 + 2 E_0 E_1 \sin \omega t + E_1^2 \sin^2 \omega t)$$

Since $\sin^2 \omega t = \frac{1}{2}(1 - \cos 2\omega t)$, the primary component of the force varies at a rate which is twice the rate of the applied AC signal.

The foregoing method of controlling the gap between the cantilever tip and the photoresist surface is referred to as the frequency modulation technique. As described, a feedback circuit maintains the cantilever vibrating at its resonant frequency, and the sample is moved so as to keep the resonant frequency at a constant value. An alternative method of controlling the gap between the cantilever tip and the photoresist surface is referred to as "slope detection". The cantilever is excited at a fixed frequency above its resonant frequency, and a feedback circuit moves the sample so as to maintain a constant amplitude of vibration of the cantilever. When using the slope detection technique, it is important to maintain the excitation frequency at a level above the resonant frequency to avoid crashes of the cantilever with the surface of the photoresist.

Figure 10A:
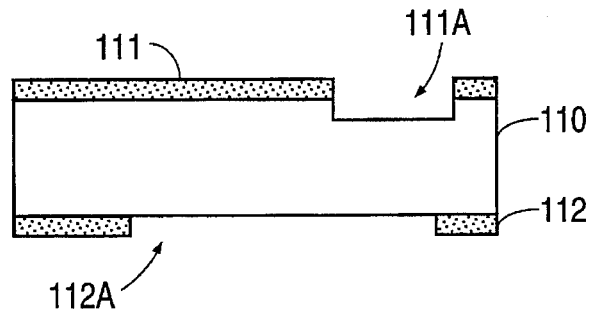
FIGS. 10A–10P illustrate a process of fabricating the cantilever.
Figure 10B:
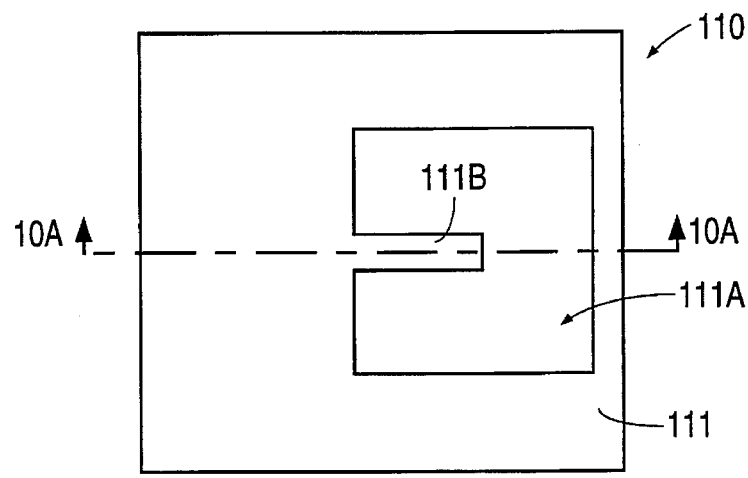
Figure 10C:
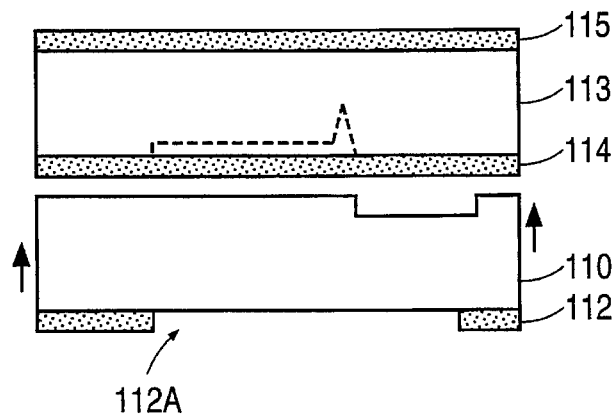
Figure 10D:
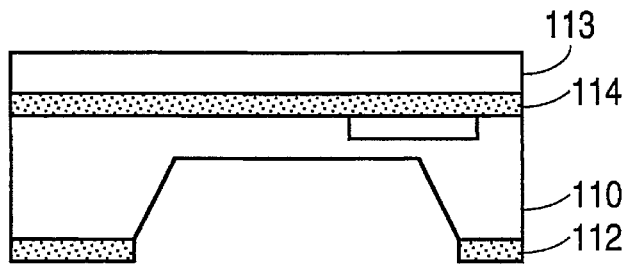
Figure 10E:
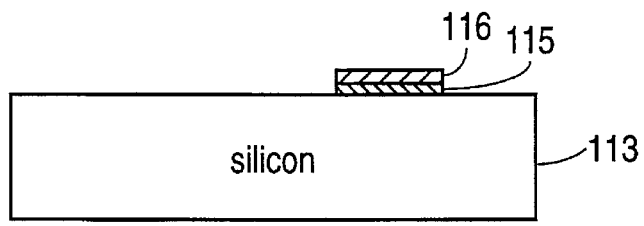
Figure 10F:
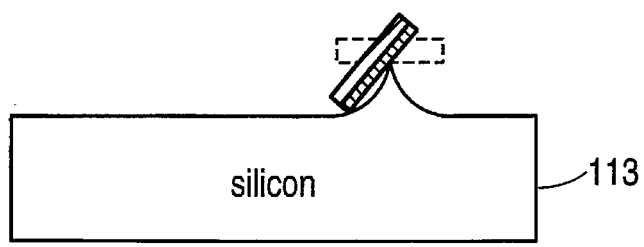
Figure 10G:
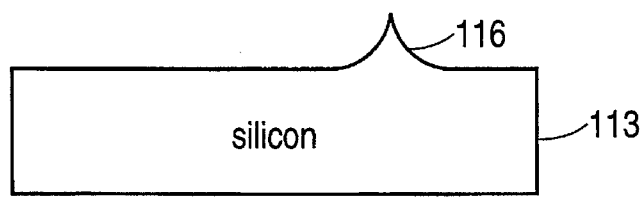
Figure 10H:
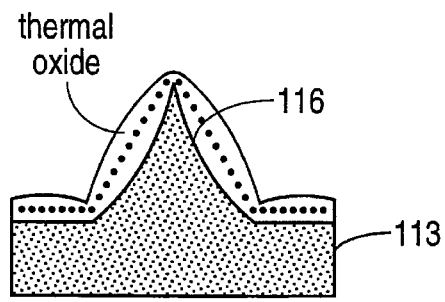
Figure 10I:
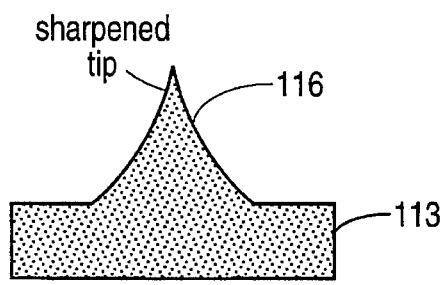
Figure 10J:
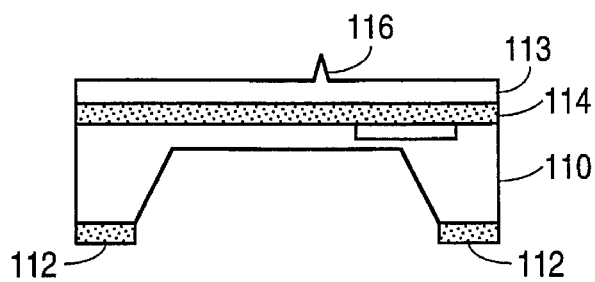
Figure 10K:
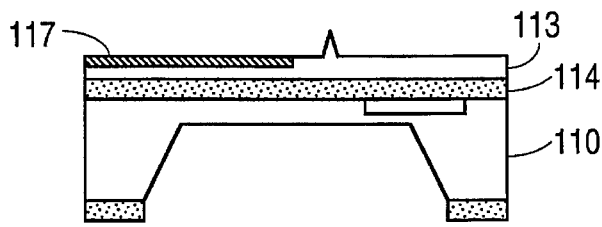
Figure 10L:
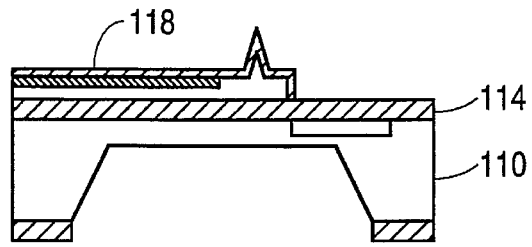
Figure 10M:
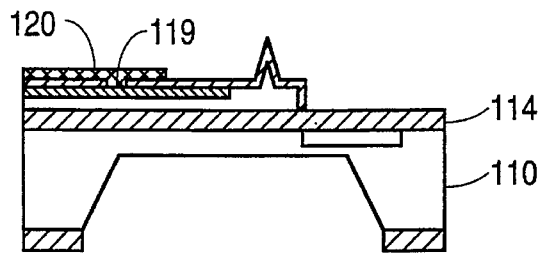
Figure 10N:
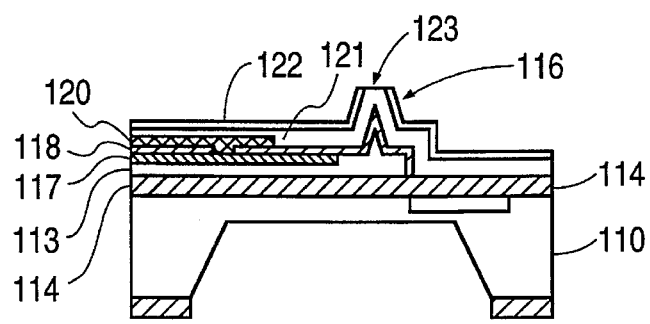
Figure 10O:
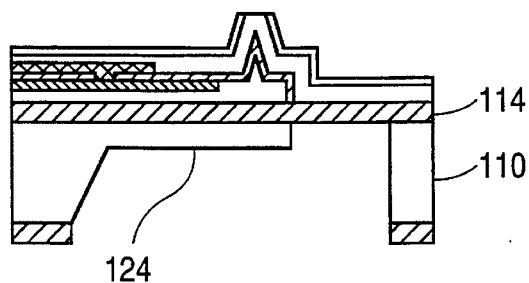
Figure 10P:
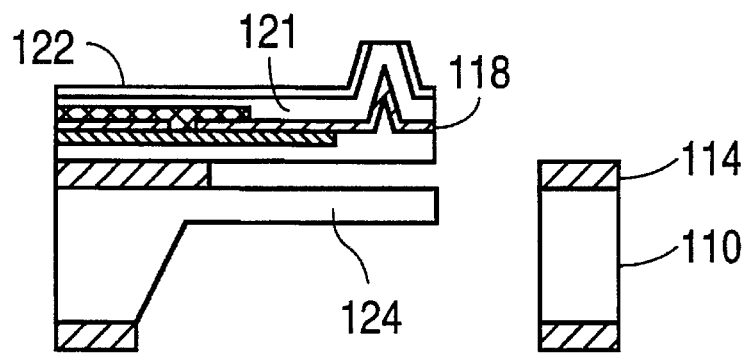

FIGS. 10A–10P illustrate the steps of a process for fabricating the cantilever. The starting point is a silicon wafer 110, shown in FIG. 10A, the sides of which are patterned with SiO$_2$ layers 111 and 112. An opening 111A in SiO$_2$ layer 111 is reactive ion etched to a depth of about 20 μmm, and a window 112A is formed in layer 112. FIG. 10B, which is a view of wafer 110 from above, shows the actual shape of opening 111A and the cross section 10A–10A at which FIG. 10A is taken. A protrusion 111B marks the area where the capacitive plate will be formed.

After opening 111A is formed, SiO$_2$ layer 111 is removed, and a second wafer 113, whose surfaces are covered by SiO$_2$ layers 114 and 115, respectively, is silicon-fusion-bonded to the top surface of wafer 110. Before bonding, wafers 110 and 113 are cleaned, and their surfaces are hydrolyzed before bringing them into contact. The silicon-fusion-bonding may be performed in an oxidation furnace for four hours at about 1100° C. This part of the process is illustrated in FIG. 10C. Any undesirable SiO$_2$ formed in window 112A on the bottom of wafer 110 during this step may be removed by re-masking and buffered HF etching this side. At the same time, SiO$_2$ layer 115 is etched.

Next, wafers 110 and 113 are subjected to time-controlled KOH etching until a membrane about 30 μm thick remains on either side of SiO$_2$ layer 114. The resulting structure is illustrated in FIG. 10D. Since FIG. 10D is a cross-sectional view, it is apparent that the depression formed by the KOH etch is in the form of a truncated, four-sided pyramid.

FIGS. 10E–10G illustrate the fabrication of a tip in top silicon layer 113 (the other layers are not shown in FIGS. 10E–10G). As shown in FIG. 10E, a masking material consisting of an oxide layer 115 and a photoresist layer 116 is patterned into a circle on the top surface of layer 113. The masking material may alternatively contain a nitride, a refractory metal or any other material that is not etched by the silicon etchant. The thickness of the masking material depends on the desired height of the tip and the etch selectivity between the masking material and the silicon substrate. An oxide layer 2000 Å thick is sufficient to make tips 10 μm in height and a 1000 Å layer of evaporated aluminum may be used to make tips 100 μm in height.

Next, as shown in FIG. 10F, silicon layer 113 is etched in either a plasma or wet etchant. Although most of the etching occurs in the vertical direction, there is some finite undercutting of the mask. By carefully monitoring the etching process through periodic optical inspections, the etching can be stopped just prior to or just after the masking material caps have fallen off. These two possibilities are illustrated in FIG. 10F. In practice, the caps usually fall off and come to rest against the tip. The cap is then selectively removed and a conical tip 116 is exposed, as shown in FIG. 10G.

A possible problem with the foregoing process is that the etching conditions and durations are critical for the proper formation of the conical member. Since etching rates and durations are two of the least controllable fabrication parameters, a fabrication process that relies heavily on them is usually very difficult to reproduce from wafer to wafer or even across a single wafer. Plasma etching is very non-uniform, so that the tips in the center may take longer to form than the tips at the perimeter of the wafer. If wet etching is used, the etch time becomes more critical since the caps are washed away in the etchant and the tips are quickly attacked. It has been found that after the initial fabrication process the apexes of the conical tips typically have radii of curvature of approximately 500 Å.

In order to make the tips sharper and at the same time increase their uniformity, they can be sharpened using a low temperature thermal oxidation process, as illustrated in FIGS. 10H and 10I. FIG. 10H shows conical tip 116 after it has been thermally oxidized at 950° C. to form an oxide layer 2000 Å to 1 μm in thickness. When the oxide is selectively removed in an HF acid solution, tip 116 is sharper and has a higher aspect ratio than it had prior to oxidation. The resulting form of tip 116 is shown in FIG. 10I. This process may be repeated several times to attain the required degree of sharpness. The mechanism of oxidation that led to the sharpening process is described in detail in R. B. Marcus and T. T. Sheng, "The Oxidation of Shaped Silicon Surfaces", J. Electrochem. Soc., Vol. 129, No. 6, pp. 1278–1282, June 1982, which is incorporated herein by reference.

FIG. 10J shows the sharpened conical tip 116 protruding from top silicon layer 113.

After tip 116 is formed, boron is implanted in layer 113 at a dose of $5 \times 10^{14}$ cm$^{-2}$ and an energy of 80 keV to form a piezoresistor 117. This results in a sheet resistance of 270Ω. Piezoresistor 117 is formed in a U-shape by masking the top surface of the substrate by a known photolithographic technique (see piezoresistor 28 in FIG. 2A). A metal mask may be used. The results of this process are illustrated in FIG. 10K.

Next, an oxide layer is formed to protect the silicon from subsequent processing. A layer 300 Å thick may be formed by wet oxidation at 900° C. for 10 minutes. A layer of photoresist is applied, and the shape of the cantilever is defined by standard photolithography techniques. During this and subsequent photolithography steps a thick photoresist layer is used to protect the tip. The silicon is then etched in a plasma etcher until oxide layer 114 stops the etch. After the photoresist is stripped, the oxide layer is removed and a new, thicker (e.g. 5000 Å) thermal oxide layer 118 is grown. The result is illustrated in FIG. 10L. This last oxidation step causes the boron to diffuse into the cantilever. Alternatively, the boron implantation could be done after the oxidation.

Another photolithography step is used to open contact holes 119 in the oxide layer 118. An aluminum layer 120 (containing 1% silicon) is sputtered, with the results shown in FIG. 10M. In one embodiment, layer 120 is 5 μm thick. Aluminum layer 120 forms the thicker ("bending") portion of the cantilever and also makes contact with the ends of photoresistor 117. Aluminum layer 120 is split to avoid a short across photoresistor 117. Aluminum layer 120 is formed by a photolithography process. A forming gas anneal at 400° C. for 45 minutes anneals the contacts.

A Si$_3$N$_4$ layer 121 is then deposited on oxide layer 118 an aluminum layer 120 by means of a low stress LPCVD (low pressure chemical vapor deposition) process. In this embodiment, Si$_3$N$_4$ layer 121 is about 3000 Å A thick. An Al layer 122, preferably about 500 Å thick, is then deposited on Si$_3$N$_4$ layer 121. Si$_3$N$_4$ layer 121 forms a waveguide, bounded by oxide layer 118 and Al layer 122 (see waveguide 23 in FIG. 1). Si$_3$N$_4$ layer 121 and Al layer 122 conform to the shape of conical tip 116. An optical aperture 123 is opened at the apex of tip 116 by a focused ion beam (FIB) process. An imaging mode of the FIB generator is used to identify the location of the apex, and the FIB generator is then turned up to form optical aperture 116. The results of these processing steps are illustrated in FIG. 10N.

Reactive ion etching is then performed on the bottom of wafer 110 to form a capacitive plate 124, as shown in FIG. 10O. Finally, extended buffered HF etching of Sio$_2$ layer 113 forms a gap 125 between cantilever and capacitive plate 124, as shown in FIG. 10P.

Figure 11:
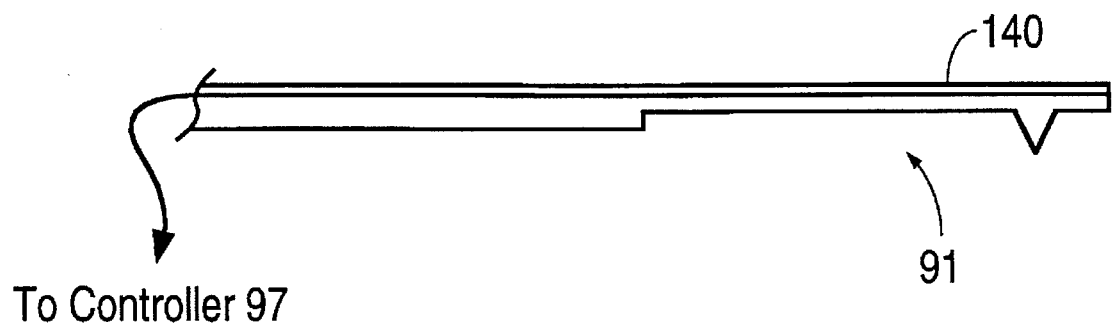
FIG. 11 illustrates an alternative embodiment of an individual cantilever.

Referring again to FIG. 9, in an alternative embodiment capacitive plate 99 is omitted, and cantilever 91 is formed with a metal layer 140 formed on the top surface of cantilever 91, as shown in FIG. 11. Metal layer 140 could be sputtered or electroplated. Metal layer 140 is electrically insulated from the piezoresistor within cantilever 91 by the intervening silicon (see FIG. 10P).

If a current is passed through metal layer 140, metal layer 140 will heat up and cause cantilever 91 to bend in the manner of a bimetallic strip. An error signal which, as described above, represents the gap between the cantilever and the photoresist is applied to metal layer 140, causing cantilever 91 to bend until the gap is correct. In this embodiment, an AC signal applied between cantilever 91 and wafer 98 could be used to cause cantilever 91 to vibrate.

In another embodiment, a layer of a piezoelectric material such as ZnO is substituted for metal layer 140, and a voltage is applied to the piezoelectric material. This causes the piezoelectric material to expand or contract, thereby causing cantilever 91 to bend and thereby controlling the gap between the cantilever and the photoresist.

While specific embodiments according to this invention have been described above, it will be apparent to those skilled in the art that a wide variety of alternative embodiments could be designed and fabricated without departing from the broad principles of this invention. Accordingly, it is intended that the invention, as defined in the following claims, cover all such embodiments.

I claim:

1. A photolithography system comprising:

(a) a plurality of cantilevers formed in a wafer, each of said cantilevers comprising:

a tip located near a free end of said cantilever, said tip extending in a direction perpendicular to a longitudinal axis of said cantilever;

a waveguide extending along said cantilever to an apex of said tip;

an aperture in said waveguide at said apex of said tip so as to allow electromagnetic energy to escape from said waveguide at said apex of said tip; and a piezoresistor, the resistance of said piezoresistor varying as said cantilever bends;

(b) a light switch positioned in each of said waveguides; and (c) a controller for opening and closing each of said light switches.

2. The photolithography system of claim 1 further comprising a capacitive plate positioned adjacent each of said cantilevers, said capacitive plate being adapted to cause said cantilever to vibrate when said capacitive plate is energized by an oscillating voltage signal.

3. The photolithography system of claim 2 further comprising a source of a superimposed AC-DC voltage connected to said capacitive plate.

4. The photolithography system of claim 3 wherein a frequency of the AC portion of said superimposed AC-DC voltage is equal to one-half of a resonant frequency of said cantilever.

5. The photolithography system of claim 3 wherein a frequency of the AC portion of said superimposed AC-DC voltage is greater than a resonant frequency of said cantilever.

6. The photolithography system of claim 1 further comprising a means for vibrating each of said cantilevers.

7. The photolithography system of claim 1 wherein each of said cantilevers comprises a thick section and a thin section.

8. The photolithography system of claim 7 wherein said piezoresistor is located within said thin section of each of said cantilever.

9. The photolithography system of claim 1 further comprising a resistance detector connected to each of said piezoresistors.

10. The photolithography system of claim 9 wherein said resistance detector comprises a bridge circuit.

11. The photolithography system of claim 1 further comprising a detector positioned near an end of each of said cantilevers, said detector being actuated when said switch allows electromagnetic energy to reach said tip.

12. The photolithography system of claim 11 wherein said detector comprises a diode.

13. The photolithography system of claim 1 further comprising a large planar waveguide, said large planar waveguide comprising a plurality of lenses, each of said lenses being for directing light energy into one of said waveguides.

14. The photolithography system of claim 13 further comprising a collimating lens for directing light energy to each of said lenses.

15. The photolithography system of claim 1 further comprising a flat substrate positioned under each of said tips.

16. The photolithography system of claim 15 further comprising a scanner for scanning said cantilevers in a plane parallel to the flat substrate.

17. The photolithography system of claim 16 wherein said scanner comprises a stepping component and an oscillating component.

18. The photolithography system of claim 17 wherein said stepping component drives said wafer and said oscillating component drives said substrate.

19. The photolithography system of claim 15 wherein said substrate is coated with a layer of resist.

20. The photolithography system of claim 1 wherein said cantilever comprises a metal layer, said metal layer being connected to a source of an error signal, said error signal being applied to said metal layer, causing said metal layer to heat up and causing said cantilever to bend.

21. The photolithography system of claim 1 wherein said cantilever comprises a piezoelectric layer, said piezoelectric layer being connected to a source of an error signal, said error signal being applied to said piezoelectric material, causing said piezoelectric material to expand and causing said cantilever to bend.

22. The photolithography system of claim 1 further comprising a light source for emitting light into said waveguides.

23. The photolithography system of claim 22 wherein said light source comprises a laser diode.

24. The photolithography system of claim 22 wherein a diameter of said aperture is less than one-half of a wavelength of said light emitted by said light source.

25. A method of exposing a layer of photoresist on the surface of a substrate, said method comprising the steps of:

providing a cantilever, said cantilever having a tip positioned near a free end thereof, and a waveguide extending along said cantilever to an apex of said tip, said waveguide having an aperture located at said apex of said tip so as to allow electromagnetic energy to escape from said waveguide at said apex of said tip;

positioning said cantilever over said substrate, with said apex of said tip being positioned near a surface of said layer of photoresist;

scanning said cantilever over said substrate by causing a movement of said cantilever, said substrate, or both said cantilever and said substrate; and alternatively allowing electromagnetic energy to enter said waveguide and preventing said energy from entering said waveguide so as to expose selected areas of said photoresist.

26. The method of claim 25 further comprising the steps of:

causing said cantilever to vibrate;

detecting the resonant frequency of vibration of said cantilever; and using the detected resonant frequency to adjust a separation between said apex of said tip and said surface of said photoresist.

27. The method of claim 26 comprising using a capacitive plate to cause said cantilever to vibrate.

28. The method of claim 25 further comprising the steps of:

causing said cantilever to vibrate;

detecting the amplitude of the vibrations of said cantilever; and using the detected amplitude to adjust a separation between said apex of said tip and said surface of said photoresist.

* * * * *